United States Patent
Cho

(10) Patent No.: US 12,519,467 B2
(45) Date of Patent: Jan. 6, 2026

(54) SWITCH CONTROL DEVICE AND BATTERY PACK INCLUDING THE SAME

(71) Applicant: SAMSUNG SDI CO., LTD., Yongin-si (KR)

(72) Inventor: Kyusung Cho, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 92 days.

(21) Appl. No.: 18/489,602

(22) Filed: Oct. 18, 2023

(65) Prior Publication Data
US 2024/0283447 A1   Aug. 22, 2024

(30) Foreign Application Priority Data
Feb. 22, 2023   (KR) ........................ 10-2023-0023769

(51) Int. Cl.
H03K 17/51   (2006.01)
H01M 10/42   (2006.01)
H03K 3/037   (2006.01)

(52) U.S. Cl.
CPC .......... *H03K 17/51* (2013.01); *H01M 10/425* (2013.01); *H03K 3/037* (2013.01)

(58) Field of Classification Search
CPC ...... H03K 17/51; H03K 3/037; H01M 10/425
See application file for complete search history.

(56) References Cited

U.S. PATENT DOCUMENTS

| 2020/0124672 A1 | 4/2020 | Cho et al. |
| 2021/0111244 A1 | 4/2021 | Kim et al. |
| 2021/0151982 A1* | 5/2021 | Cho ............ H02H 1/0007 |

(Continued)

FOREIGN PATENT DOCUMENTS

| EP | 3575139 A1 | 12/2019 |
| EP | 3823001 A1 | 5/2021 |
| KR | 10-1640137 B1 | 7/2016 |

(Continued)

OTHER PUBLICATIONS

EPO Extended European Search Report dated May 8, 2024, issued in corresponding European Patent Application No. 23206221.6, 8 pages.

(Continued)

*Primary Examiner* — Daniel C Puentes
(74) *Attorney, Agent, or Firm* — Womble Bond Dickinson (US) LLP

(57) ABSTRACT

A switch control device includes: a retention circuit receiving a control signal and a safety signal, and outputting a retention signal to the driver of the switch to maintain an on state of the switch based on the control signal and the safety signal; a retention control circuit disabling the retention circuit, so that the output of the retention signal is blocked based on a disable signal being received; a first controller outputting the control signal to the driver to control the operation of the switch, and outputting the disable signal to the retention control circuit based on the retention circuit being disabled in a system to which the switch control device is mounted; and a second controller outputting the safety signal according to the operation status of the first controller, wherein the driver controls the opening/closing of the switch based on the control signal or the retention signal.

15 Claims, 9 Drawing Sheets

(56) References Cited

U.S. PATENT DOCUMENTS

2022/0376489 A1* 11/2022 Kim .................. H02J 7/0031

FOREIGN PATENT DOCUMENTS

| KR | 10-2121639 | B1 | 6/2020 |
| KR | 10-2021-0042680 | A | 4/2021 |
| KR | 10-2021-0059326 | A | 5/2021 |

OTHER PUBLICATIONS

National Semiconductor: "LM139/LM239/LM339 A Quad of Independently Functioning Comparators," Internet Citation, Jan. 1973, 20 pages, XP002811324, Retrieved from the Internet: URL: http://www.bitsavers.org/components/national/_appNotes/AN-0074.pdf.

* cited by examiner

SWITCH CONTROL DEVICE AND BATTERY PACK INCLUDING THE SAME

CROSS-REFERENCE TO RELATED APPLICATIONS

The present application claims priority to and benefit of Korean Patent Application No. 10-2023-0023769 filed on Feb. 22, 2023, in the Korean Intellectual Property Office, the entire content of which is incorporated herein by reference.

BACKGROUND

1. Field

Aspects of some embodiments of the present disclosure relate to a switch control device, and a battery pack including the same.

2. Description of Related Art

Recently, according to strengthening of environmental regulations including CO2 regulations, interest in environmentally-friendly vehicles has been increasing. Accordingly, vehicle companies have been actively researching and developing pure electrical vehicles and hydrogen vehicles as well as hybrid and plug-in hybrid vehicles.

A high voltage battery for storing electrical energy obtained from various energy sources may be applied to the environmentally-friendly vehicles. A high voltage storage system of a vehicle may use high voltage electrical energy supplied from a high voltage battery for driving or electrical needs of the vehicle.

In the battery pack, the output of the battery pack may be transmitted to a load or blocked by a switch such as a relay or a contactor. When the switch that transfers the output of the battery pack to the load is opened due to an error in the control device while the vehicle is running using the electrical energy of the battery pack, the driving force of the vehicle is lost, and as a result, the control of the driver of the vehicle is disabled, thereby leading to a safety accident. In order to solve this problem, the battery packs may also be designed to include a retention circuit that retains the operation state of the switch in the previous state for a predetermined time period when the control device malfunctions.

On the other hand, some customers request the non-use of such a retention circuit. In addition, in a situation where the battery pack or the vehicle causes an unknown malfunction due to the aging of the battery pack or the vehicle, the retention circuit may be the cause of the malfunction.

The above information disclosed in this Background section is only for enhancement of understanding of the background and therefore the information discussed in this Background section does not necessarily constitute prior art.

SUMMARY

The technical object to be solved through present disclosure is to provide a switch control device that may disable/enable a retention circuit to retain the operation state of the switch in the previous state for a predetermined time period in a case of the malfunction of the control device, and a battery pack including the same.

A switch control device according to some embodiments of the present disclosure includes a retention circuit configured to receive a control signal and a safety signal, and to output a retention signal to the driver of the switch to maintain the on state of the switch based on the control signal and the safety signal; a retention control circuit configured to disable the retention circuit, so that the output of the retention signal is blocked if a disable signal is received; a first controller configured to output the control signal to the driver to control the operation of the switch, and to output the disable signal to the retention control circuit if the retention circuit is predetermined to be disabled in a system to which the switch control device is mounted; and a second controller configured to output the safety signal according to the operation status of the first controller. According to some embodiments, the driver may be configured to control the opening/closing of the switch based on the control signal or the retention signal.

According to some embodiments, the retention circuit may include a latch circuit configured to receive the control signal and the safety signal, and to start outputting the retention signal according to the control signal if the safety signal indicates an abnormal state of the first controller, and a timer circuit configured to stop the output of the retention signal if a predetermined time period elapses after the latch circuit starts outputting the retention signal.

According to some embodiments, the latch circuit may be further configured to delay the received control signal for a predetermined time period if the control signal is received, and to start the output of the retention signal if the delayed control signal indicates the on state of the switch.

According to some embodiments, the latch circuit may include a first comparison voltage generation circuit configured to generate a first comparison voltage whose voltage level is determined according to the safety signal, a second comparison voltage generation circuit configured to generate a second comparison voltage whose voltage level is determined according to the delayed control signal, a comparator configured to control the output of the retention signal if the second comparison voltage is higher than the first comparison voltage, and a diode including an anode connected to the output terminal of the comparator and a cathode connected between the input terminal of the comparator and the second comparison voltage generation circuit.

According to some embodiments, the voltage level of the first comparison voltage may become a first level if the safety signal corresponds to the abnormal state of the first controller, and may become a second level if the safety signal indicates the normal state of the first controller. According to some embodiments, the voltage level of the second comparison voltage may become the third level if the delayed control signal corresponds to the off state of the switch, and may become the fourth level if the delayed control signal corresponds to the on state of the switch. According to some embodiments, the diode may maintain the voltage level of the second comparison voltage at a fifth level regardless of the control signal if the comparator starts outputting the retention signal. According to some embodiments, the second level may be higher than the first level. According to some embodiments, the fourth level may be higher than the third level. According to some embodiments, the fourth level may be lower than the second level and higher than the first level. According to some embodiments, the fifth level may be higher than the second level.

According to some embodiments, the timer circuit may include a third comparison voltage generation circuit configured to generate a third comparison voltage whose voltage gradually increases in response to the output time of the retention signal if the retention signal is output from the retention circuit, a fourth comparison voltage generation circuit configured to generate a fourth comparison voltage whose voltage level is determined according to the control signal and the safety signal, and a timer output circuit configured to output a timer signal according to the third comparison voltage and the fourth comparison voltage. According to some embodiments, the third comparison voltage may become equal to or greater than the fourth comparison voltage if a predetermined time period elapses after the retention signal output starts. According to some embodiments, the timer output circuit may be further configured to output the timer signal to stop the output of the retention signal if the third comparison voltage is higher than the fourth comparison voltage.

According to some embodiments, the retention control circuit may include a latch on circuit configured to output a latch on signal if the disable signal is received, a latch circuit configured to start outputting a latch signal if the latch on signal is output from the latch on circuit, and an output circuit configured to output an off signal to the retention circuit to block the output of the retention signal if the latch signal is output from the latch circuit.

According to some embodiments, the latch on circuit may include a transistor including a control terminal to which the disable signal is input, a first terminal connected to the latch circuit, and a second terminal connected to a ground. According to some embodiments, if the disable signal is input to the control terminal, the transistor may be turned on and output the latch on signal to the latch circuit.

According to some embodiments, the latch circuit may include a comparator including a first input terminal connected to the first node connected to the latch on circuit, a second input terminal connected to the second node, and an output terminal, and configured to control the output of the latch signal according to the result of comparing the voltage of the first node and the second node, a first voltage distribution circuit configured to transmit the first voltage distributed from the power voltage to the first node, a second voltage distribution circuit configured to transmit the second voltage distributed from the power voltage to the second node, and a diode including an anode connected to the output terminal of the comparator and a cathode connected to the second node, and configured to transmit a third voltage to the second node if the output of the latch signal starts.

According to some embodiments, if the latch on signal is output from the latch on circuit, the voltage of the second node may be changed to the voltage of the latch on signal. According to some embodiments, the second voltage may be lower than the first voltage, and the voltage of the latch on signal may be lower than the second voltage. According to some embodiments, the third voltage may be higher than the first voltage.

According to some embodiments, the output circuit may include a transistor including a control terminal to which the latch signal is input, a first terminal connected to the retention circuit, and a second terminal connected to a ground. According to some embodiments, the transistor may be turned on and output the off signal to the retention circuit if the latch signal is input to the control terminal.

According to some embodiments, the first controller may be further configured to output a reset signal to the retention control circuit if the enable of the retention circuit is requested from the system. According to some embodiments, the retention control circuit may further include a latch off circuit configured to block output of the latch signal if the reset signal is received while the retention circuit is disabled.

According to some embodiments, the latch off circuit may include a transistor including a control terminal to which the reset signal is input, a first terminal connected to the latch circuit, and a second terminal connected to a ground. According to some embodiments, if the reset signal is input to the control terminal, the transistor may be turned on and output a latch off signal to block the output of the latch signal to the latch circuit. According to some embodiments, if the latch off signal is received, the latch circuit may turn off the latch function to block the output of the latch signal.

According to some embodiments, a battery pack includes a battery module; a switch configured to control an electrical connection between the battery module and the load; a driver configured to control the opening/closing of the switch; and the switch control device including at least one of the aforementioned characteristics. According to some embodiments, the driver may be further configured to control the opening/closing of the switch according to a signal received from the switch control device.

According to some embodiments of the present disclosure, during a malfunction of the control device, the retention circuit for maintaining the operation state of the switch in the previous state for a predetermined time period may be disabled/enable if necessary.

DETAILED DESCRIPTION

Figure 1:
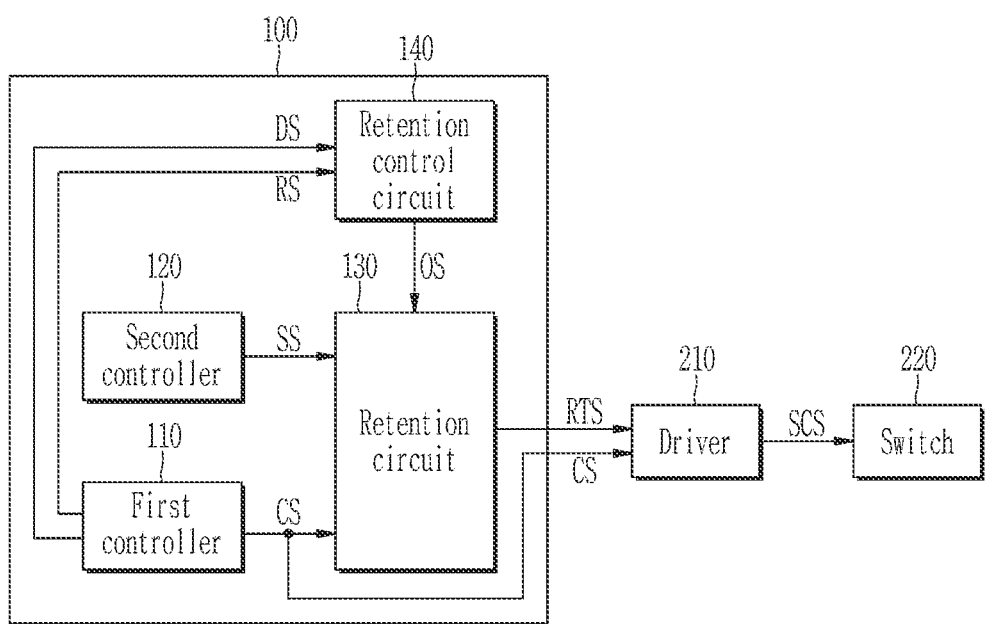
FIG. 1 is a view schematically showing a switch control device according to some embodiments.

Hereinafter, aspects of some embodiments of the present invention are described in more detail with reference to the accompanying drawings. Hereinafter, the description describes effects and characteristics of some embodiments and a method for implementing the same are described in more detail with reference to the accompanying drawings. The same reference numerals denote the same elements in the drawings, and overlapping descriptions thereof are omitted. However, embodiments according to the present invention may be implemented in various forms and should not be construed as being limited to the embodiments described herein. Rather, these embodiments are provided as examples so that the present invention is thoroughly and completely understood, and will more fully convey the aspects and characteristics of some embodiments of the present invention to those skilled in the art.

Accordingly, the description may not describe any processes, elements or techniques deemed not necessary to those skilled in the art for the thorough understanding of the aspects and characteristics of the present invention. The drawings may exaggeratedly show relative sizes of elements, layers and regions for clarity.

Term "and/or" in this specification may include all combinations or any combination of a plurality of related listed items. Usage of "may" or "may be" in describing the example embodiments of the present invention may indicate "may" or "may be" in "one or more example embodiments of the present invention.". In the following description of the example embodiments of the present invention, a term in a singular form may include its plural form unless the context clearly indicates otherwise.

In this specification, terms including ordinal numbers such as "first," "second," "third" and the like are used to describe various components. However, these components are not limited by these terms. These terms are used only to distinguish one component from another component. For example, a 'first' component may be named a 'second' component and the 'second' component may also be similarly named the 'first' component, without departing from the scope of the present invention.

In this specification, when one component or layer is described as being "on," "connected to," or "coupled to" another component or layer, it may be "directly on" another component or layer or "connected to" and "coupled to" another component or layer interposing one or more other components or layers. In addition, when a component or layer is described as being "between" two components or layers, it should be understood as only one component or layer between the two components or layers, or one or more other components or layers interposed between the same.

In this specification, a case where two components are electrically connected to each other may not only include a case where the two components are directly connected to each other, but also include a case where the two components are connected to each other through another component. Another component may include a switch, a resistor, a capacitor or the like. In describing aspects of some example embodiments, an expression "to connect" may indicate "to electrically connect" when there is no expression "to directly connect.".

Hereinafter, a switch control device, and a battery pack including the same according to some embodiments will be described in more detail with reference to the drawings.

FIG. 1 is a view schematically showing a switch control device according to some embodiments.

Referring to FIG. 1, a switch control device 100 may include a first controller 110, a second controller 120, a retention circuit 130, and a retention control circuit 140.

The first controller 110 may determine whether to open/close the switch 220 and output a control signal (Control Signal, CS) for controlling the switch 220. For example, the first controller 110 may output the control signal CS of high level to control the switch 220 to an on state (i.e., a closed state), and the control signal CS of low level to control the switch 220 to an off state (i.e., opened state). Of the control signal CS. In this document, the high level of each signal may represent a power voltage (e.g., 5V) of the first controller 110 or a voltage level close to the power voltage, and the low level of each signal may represent a ground voltage 0V or a voltage level close to the ground voltage.

The first controller 110 may output a disable signal (DS) or a reset signal (RS) to disable or enable the retention circuit 130 described later.

The first controller 110 is set to disable the retention circuit 130 in the system equipped with the switch control device 100, if the disable of the retention circuit 130 is requested from the system, may output the disable signal DS to disable the retention circuit 130 not so as to be operated. If the enabling of the disabled retention circuit 130 is requested from the system in which the switch control device 100 is mounted, the first controller 110 may output the reset signal RS to enable the retention circuit 130 to be operated.

The second controller 120 may monitor the operation state of the first controller 110. For example, the second controller 120 continuously communicates with the first controller 110, and the operation state of the first controller 110 may be determined from the communication state with the first controller 110. In addition, for example, the second controller 120 may periodically receive an error detection signal from the first controller 110 in order to detect the operation state of the first controller 110, and may determine the operation state of the first controller 110 according to the reception status (a reception status, a pulse width, a reception period, etc.) of the error detection signal. The second controller 120 may output a safety signal (SS) indicating the operation state of the first controller 110, that is, whether the operation is normal. For example, the second controller 120 may output the safety signal of high level during the normal operation of the first controller 110, and output the safety signal of low level during the abnormal operation of the first controller 110.

The retention circuit 130 may receive the control signal CS and the safety signal SS from the first controller 110 and the second controller 120, respectively. The retention circuit 130 may generate retention signal (RTS) of high level according to the control signal CS and the safety signal SS, and output it to the driver 210. The retention circuit 130 may control the output of the retention signal RTS according to the operation state of the first controller 110 indicated by the safety signal SS.

The retention circuit 130 may be configured not to output the retention signal RTS if the safety signal SS indicates that the first controller 110 is in the normal state.

If the safety signal SS indicates the abnormal state of the first controller 110, the retention circuit 130 may output the retention signal RTS in response to the control signal CS output immediately before in the normal state of the first controller 110. The retention circuit 130, if the safety signal SS is changed to indicate the abnormal state while the first controller 110 is outputting the control signal CS of low level in the normal state, may be configured not to output the retention signal RTS. The retention circuit 130, if the safety signal SS is changed to indicate the abnormal state while the first controller 110 is outputting the control signal CS of high level in the normal state, may output the retention signal RTS.

The retention signal RTS is the output signal of high level, and the retention circuit 130 may retain the output of low level while not outputting the retention signal RTS.

If the output of the retention signal RTS starts, the retention circuit 130 retains the output of the retention signal RTS for a time period (e.g., a set or predetermined time period), and may end the output of the retention signal RTS if a time period (e.g., a set or predetermined time period or threshold time period) elapses. If the safety signal SS is changed to indicate the normal state of the first controller 110 while outputting the retention signal RTS, the retention circuit 130 may end the output of the retention signal RTS.

The retention control circuit 140 may receive the disable signal DS or the reset signal RS from the first controller 110, and may disable or enable the retention function of the retention circuit 130 based on these signals.

If the disable signal DS is received from the first controller 110, the retention control circuit 140 may output an off signal OS to the retention circuit 130 to turn off the retention function of the retention circuit 130. Upon receiving the off signal OS in the retention circuit 130, the retention function is disabled, so that the output of the retention signal RTS may be blocked regardless of the level of the control signal CS and the safety signal SS.

If the reset signal RS is received from the first controller 110, the retention control circuit 140 may block the output of the off signal OS. If the output of the off signal OS is blocked, the retention function of the retention circuit 130 is enabled, and the retention circuit 130 may output the retention signal RTS according to the control signal CS and the safety signal SS.

The driver 210 may receive the control signal CS and the retention signal RTS from the first controller 110 and the retention circuit 130, respectively. The driver 210 generates a switch control signal SCS based on the control signal CS and the retention signal RTS, and may use it to control the switch 220 (e.g., a contactor, a relay, etc.) to be turned on or off. The driver 210 may be an OR circuit having the control signal CS and the retention signal RTS as inputs. For example, if at least one signal of the control signal CS and the retention signal RTS is a high level, the driver 210 may output the switch control signal SCS for controlling the switch 220 to an on state. Also, for example, if the control signal CS and the retention signal RTS are the low level, the driver 210 may output the switch control signal SCS to control the switch 220 in an off state.

Figure 2:
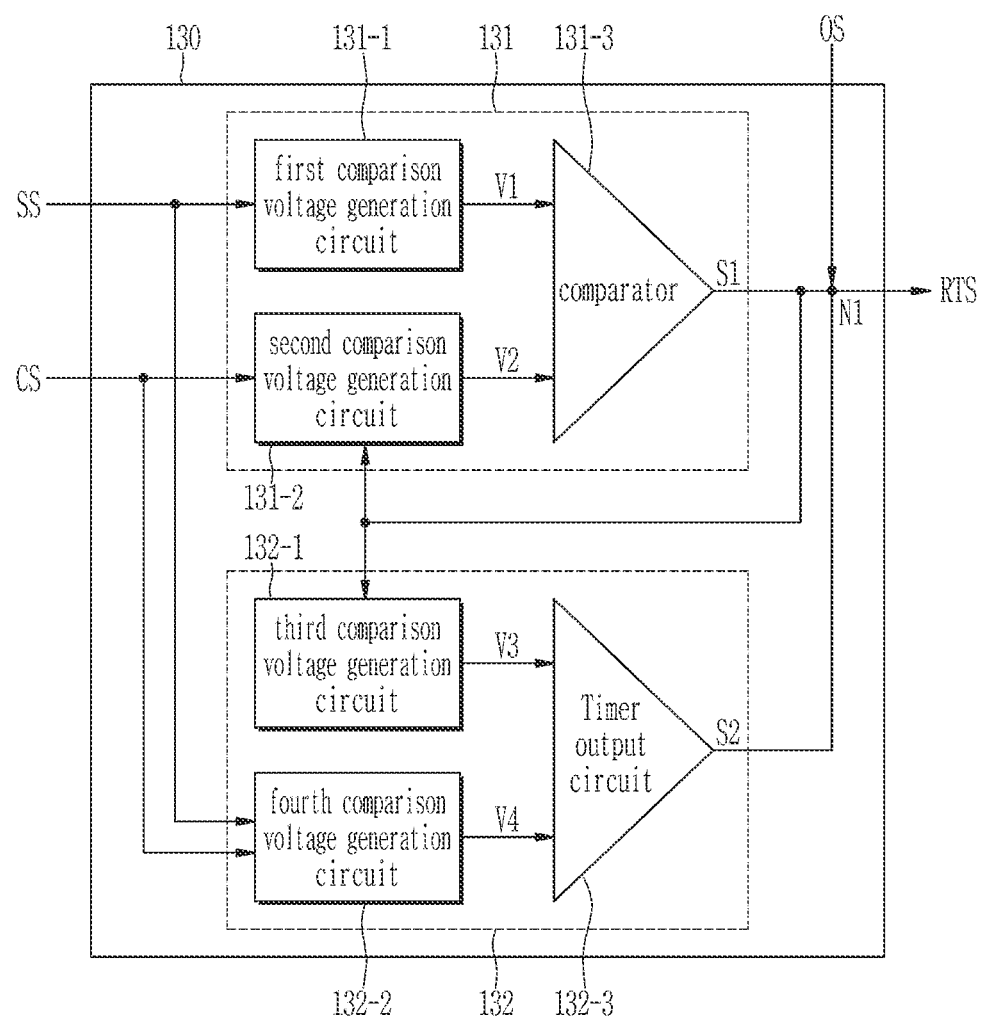
FIG. 2 is a view schematically showing a retention according to some embodiments.

FIG. 2 is a view schematically showing a retention circuit according to some embodiments.

Referring to FIG. 2, the retention circuit 130 may include a latch circuit 131 and a timer circuit 132.

The latch circuit 131 may receive the control signal CS and the safety signal SS from the first controller 110 and the second controller 120, respectively, and generate a retention signal RTS based on the control signal CS and the safety signal SS. That is, the latch circuit 131 is operated in the abnormal state while the first controller 110 is outputting the control signal CS of high level, as a result, if the control signal CS of low level and the safety signal SS of low level are input, the retention signal RTS to maintain the on state of the switch 220 may be generated.

The latch circuit 131 may include a comparator 131-3 and comparison voltage generation circuits 131-1 and 131-2 respectively connected to input terminals of the comparator 131-3.

The first comparison voltage generation circuit 131-1 may be connected between the second controller 120 and the first input terminal of the comparator 131-3. The first comparison voltage generation circuit 131-1 may receive the safety signal SS from the second controller 120 and generate the first comparison voltage V1 according to the level of the received safety signal SS.

The first comparison voltage generation circuit 131-1 may control the voltage level of the first comparison voltage V1 to be a first level if the safety signal SS of the voltage level (i.e., the low level) indicating the abnormal state of the first controller 110 is input. The first comparison voltage generation circuit 131-1 may control the voltage level of the first comparison voltage V1 to be a second level if the safety signal SS of the voltage level (i.e., high level) indicating the normal state of the first controller 110 is input. The second level may have a higher value than the first level.

The first comparison voltage generation circuit 131-1 may include a resistor, a capacitor, and a transistor to generate the first comparison voltage V1 based on the safety signal SS.

The first comparison voltage generation circuit 131-1 may transfer the generated first comparison voltage V1 to the first input terminal of the comparator 131-3.

The second comparison voltage generation circuit 131-2 may be connected between the first controller 110 and the second input terminal of the comparator 131-3. The second comparison voltage generation circuit 131-2 may receive the control signal CS from the first controller 110 and generate the second comparison voltage V2 according to the voltage level of the received control signal CS.

The second comparison voltage generation circuit 131-2 may control the voltage level of the second comparison voltage V2 to be a third level if the control signal CS of the voltage level (i.e., low level) indicating the off state of the switch 220 is input. The second comparison voltage generation circuit 131-2 may control the voltage level of the second comparison voltage V2 to be a fourth level if the control signal CS of the voltage level (i.e., high level) indicating the on state of the switch 220 is input. The fourth level may have a higher value than the third level. The third level may have a lower value than the first level. The fourth level may have a value lower than the second level and higher than the first level.

If the control signal CS is received, the second comparison voltage generation circuit 131-2 passes the received control signal through a buffer, to be delayed for a time period (e.g., a set or predetermined time period), and may generate the second comparison voltage V2 by using the delayed control signal. Therefore, if the level of the control signal CS is changed, the voltage level of the second comparison voltage V2 may be changed after a time period (e.g., a set or predetermined time period) after the level of the control signal CS fluctuates.

The second comparison voltage generation circuit 131-2 is connected to the output terminal of the comparator 131-3, and may change the voltage level of the second comparison voltage V2 in response to the signal S1 received from the output terminal of the comparator 131-3. If the signal S1 of low level is input from the output terminal of the comparator 131-3, the second comparison voltage generation circuit 131-2 may determine the voltage level of the second comparison voltage V2 according to the voltage level of the control signal CS as described above. The second comparison voltage generation circuit 131-2 may change the voltage level of the second comparison voltage V2 to the fifth level regardless of the voltage level of the control signal CS if the signal S1 of high level is input from the output terminal of the comparator 131-3. The fifth level may have a higher value than the fourth level and the second level.

The second comparison voltage generation circuit 131-2 may be configured to include a resistor, a capacitor, and a transistor to generate the second comparison voltage V2 according to the control signal CS. In addition, the second comparison voltage generation circuit 131-2 may further include a diode to change the level of the second comparison voltage V2 according to the signal S1 input from the output terminal of the comparator 131-3.

The second comparison voltage generation circuit 131-2 may transfer the generated second comparison voltage V2 to the second input terminal of the comparator 131-3.

The comparator 131-3 may include a first input terminal connected to the first comparison voltage generation circuit 131-1, a second input terminal connected to the second comparison voltage generation circuit 131-2, and an output terminal connected to the output node N1 of the retention circuit 130.

The comparator 131-3 may compare the levels of the first comparison voltage V1 and the second comparison voltage V2 generated by the first comparison voltage generation circuit 131-1 and the second comparison voltage generation circuit 131-2, and output the output signal S1 in response to the comparison result. The comparator 131-3 may output the output signal S1 of high level if the level of the second comparison voltage V2 is higher than the level of the first comparison voltage V1. The comparator 131-3 may output the output signal S1 of low level if the level of the second comparison voltage V2 is less than or equal to the level of the first comparison voltage V1.

The signal S1 output from the comparator 131-3 may be transmitted to the output node N1 of the retention circuit 130 and output as the retention signal RTS.

Figure 3A:
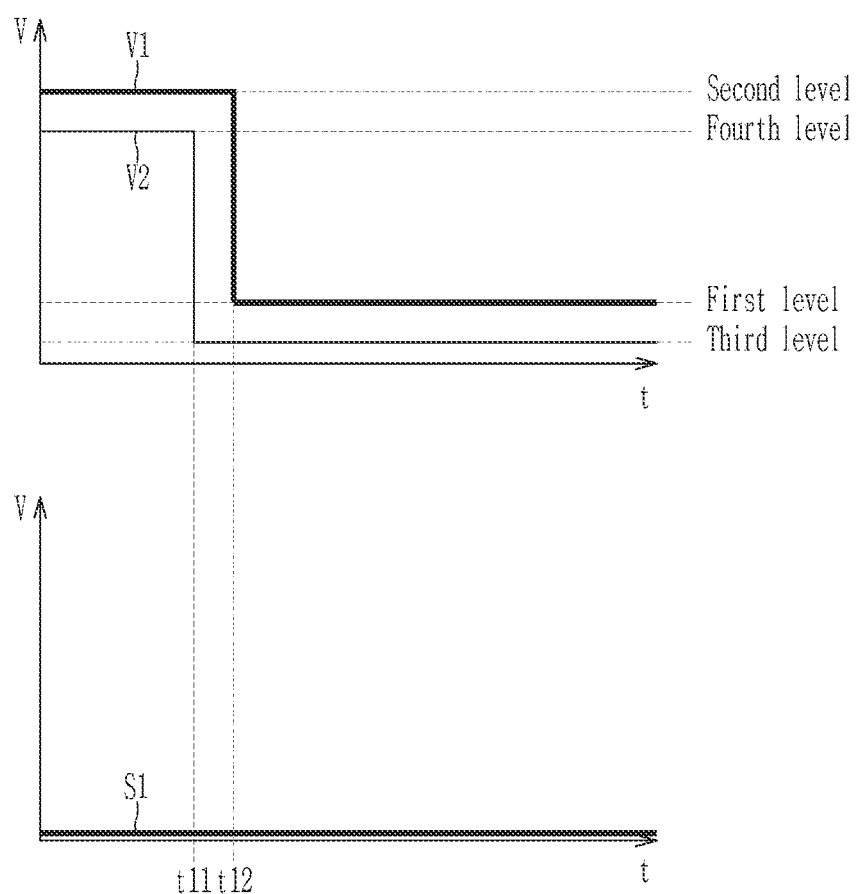
FIG. 3A and FIG. 3B are views for explaining a latch operation of a retention circuit according to some embodiments.
Figure 3B:
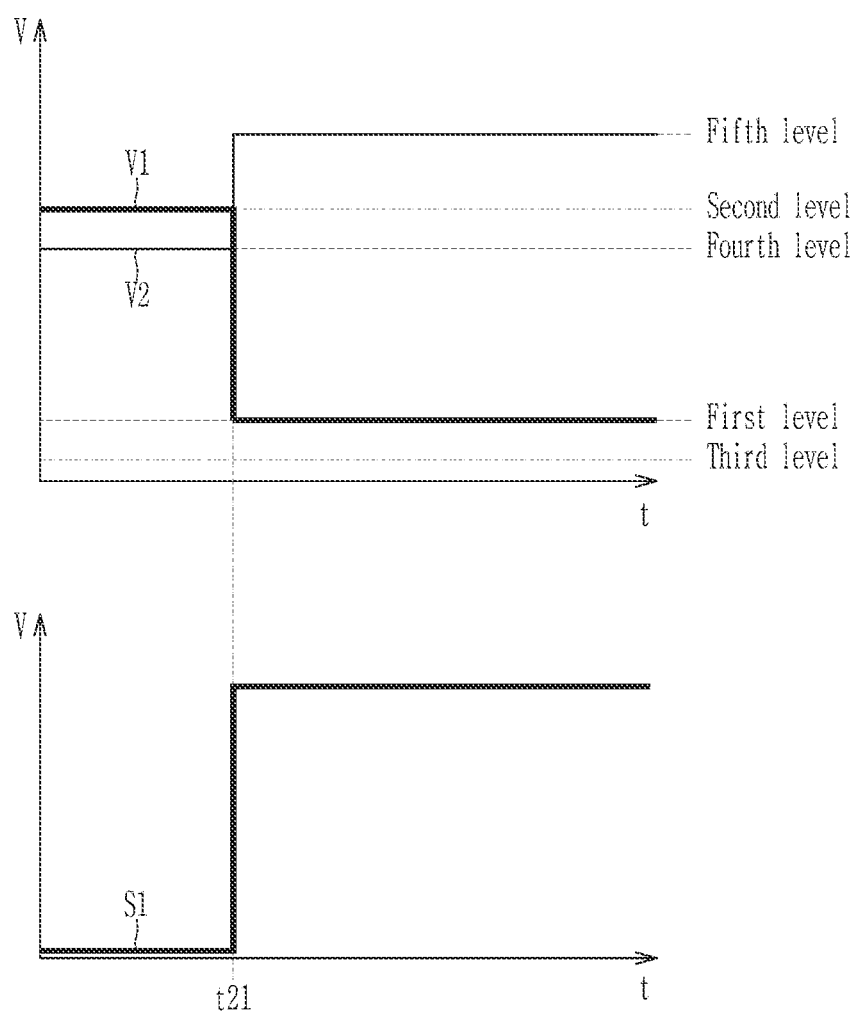

FIG. 3A and FIG. 3B are views for explaining a latch operation of a retention circuit 130 according to some embodiments.

Referring to FIG. 3A, the first controller 110 may change the control signal CS from high level to low level to be changed during a normal operation. As the control signal CS changes from the high level to the low level, the second comparison voltage generation circuit 131-2 may change the level of the second comparison voltage V2 from the fourth level to the third level at a time t11 and output the same. While the first controller 110 normally operates, the safety signal SS may maintain the high level, and the first comparison voltage V1 derived from the safety signal SS may maintain the second level. Accordingly, while the first controller 110 normally operates, the output signal S1 of the comparator 131-3 may maintain the low level.

After that, as the first controller 110 operates abnormally, the second controller 120 may change the safety signal SS to low level at a time t12 and output the same. As the safety signal SS is changed to the low level, the first comparison voltage generation circuit 131-1 may change the level of the first comparison voltage V1 from the second level to the first level and output the same. At this time, since the first level of the first comparison voltage V1 is higher than the third level of the second comparison voltage V2, the output signal S1 output from the comparator 131-3 may maintain the low level.

Referring to FIG. 3B, the first controller 110 maintains the control signal CS with high level during the normal operation and outputs the same. While the control signal CS maintains the high level, the second comparison voltage generation circuit 131-2 may output the second comparison voltage V2 of the fourth level. While the first controller 110 normally operates, the safety signal SS may maintain the high level, and the first comparison voltage V1 may maintain the second level regardless of the level of the second comparison voltage V2. Therefore, while the first controller 110 operates normally, the output signal S1 of the comparator 131-3 may maintain the low level.

After that, as the first controller 110 operates abnormally, the first controller 110 and the second controller 120 may change both the control signal CS and the safety signal SS to low level and output them. On the other hand, even if the first controller 110 changes the control signal CS to the low level, the second comparison voltage generation circuit 131-2 may maintain the second comparison voltage V2 with the fourth level for a time period (e.g., a set or predetermined time period) and output the same. On the other hand, the first comparison voltage generation circuit 131-1 may change the level of the first comparison voltage V1 from the second level to the first level at the time t21 as the safety signal SS changes to the low level and output the same. At a time that the level of first comparison voltage V1 is changed to the first level, the second comparison voltage V2 may maintain the fourth level. Since the first level of the first comparison voltage V1 is lower than the fourth level of the second comparison voltage V2, the comparator 131-3 may output the output signal S1 of high level at the time t21.

Thereafter, the output signal S1 of high level may be transmitted to the second comparison voltage generation circuit 131-2, and the second comparison voltage generation circuit 131-2 may change the level of the second comparison voltage V2 to the fifth level and output the same. Since the first level of the first comparison voltage V1 is lower than the fifth level of the second comparison voltage V2, the comparator 131-3 may continuously output the output signal S1 of high level thereafter.

As described above, if the first controller 110 is in the abnormal state while the control signal CS of high level is output, the latch circuit 131 may output the output signal S1 of high level. In addition, after the level of the output signal S1 is changed to the high level, the latch function of the latch circuit 131 is enabled so that the latch circuit 131 may continuously output the output signal S1 of high level.

Again, referring to FIG. 2, the timer circuit 132 may control the time at which the retention signal RTS is output. The timer circuit 132 receives the control signal CS and the safety signal SS from the first controller 110 and the second controller 120, respectively, and based on the control signal CS and the safety signal SS, may generate the timer signal S2 for controlling the time that the output of the retention signal RTS is maintained.

The timer circuit 132 may include a third comparison voltage generation circuit 132-1, a fourth comparison voltage generation circuit 132-2, and a timer output circuit 132-3.

The third comparison voltage generation circuit 132-1 may connect the output terminal of the comparator 131-3 and the first input terminal of the timer output circuit 132-3. The third comparison voltage generation circuit 132-1 may receive the signal S1 from the output terminal of the comparator 131-3 and generate the third comparison voltage V3 in response to the received signal S1. If the signal S1 of high level is output from the output terminal of the comparator 131-3, the third comparison voltage generation circuit 132-1 may output a third comparison voltage V3 that the voltage level gradually increases in response to the time that the signal S1 of high level is received from the output terminal of the comparator 131-3. That is, the voltage level of the third comparison voltage V3 may gradually increase in response to the time that the signal S1 of high level is received. If the signal S1 of low level is received from the output terminal of the comparator 131-3, the third comparison voltage generation circuit 132-1 gradually reduces the voltage level of the third comparison voltage V3 to be reset to the voltage level (e.g., a ground voltage) before the signal S1 of high level is received.

The third comparison voltage generation circuit 132-1 may include an RC circuit composed of a resistor and a capacitor to generate the third comparison voltage V3 whose voltage level is changed according to the output signal S1 of the comparator 131-3.

The fourth comparison voltage generation circuit 132-2 is connected to the first controller 110 and the second controller 120 and may receive the control signal CS and the safety signal SS from the first controller 110 and the second controller 120, respectively. The fourth comparison voltage generation circuit 132-2 may be connected to the second input terminal of the timer output circuit 132-3, and may output the fourth comparison voltage V4 generated based on the control signal CS and the safety signal SS to the second input terminal of the timer output circuit 132-3.

The fourth comparison voltage generation circuit 132-2 may control the voltage level of the fourth comparison voltage V4 to the sixth level if at least one voltage level of the control signal CS and the safety signal SS is the low level. The fourth comparison voltage generation circuit 132-2 may control the voltage level of the fourth comparison voltage V4 to be the seventh level if both control signal CS and safety signal SS are the high level. The sixth level may be higher than the seventh level. The seventh level may be equal to or lower than the voltage level if resetting the third comparison voltage V3.

The fourth comparison voltage generation circuit 132-2 may include a resistor, a capacitor, and a transistor to generate the fourth comparison voltage V4 whose voltage level is changed according to the control signal CS and the safety signal SS.

The timer output circuit 132-3 may include a first input terminal connected to the third comparison voltage generation circuit 132-1, a second input terminal connected to the fourth comparison voltage generation circuit 132-2, and an output terminal connected to the output node N1 of the retention circuit 130.

The timer output circuit 132-3 may compare the levels of the third comparison voltage V3 and the fourth comparison voltage V4 generated from the third comparison voltage generation circuit 132-1 and the fourth comparison voltage generation circuit 132-2 and output the timer signal S2 in respond to the comparison result. The timer output circuit 132-3 may output a timer signal S2 of high level if the level of the fourth comparison voltage V4 is higher than the level of the third comparison voltage V3. The timer output circuit 132-3 may output the timer signal S2 of low level if the level of the fourth comparison voltage V4 is less than or equal to the level of the third comparison voltage V3.

If the first controller 110 is in the abnormal state, the fourth comparison voltage generation circuit 132-2 may output the sixth level fourth comparison voltage V4. In addition, if the signal S1 of high level is output from the output terminal of comparator 131-3 in the abnormal state of the first controller 110, the third comparison voltage generation circuit 132-1 may gradually increase and output the voltage level of the third comparison voltage V3. At the beginning that the signal S1 of high level is output, the voltage level of the third comparison voltage V3 may be lower than the sixth level of the fourth comparison voltage V4. Accordingly, the timer output circuit 132-3 may output the timer signal S2 of high level. Then, if the output of the signal S1 of high level continues for a time period (e.g., a set or predetermined time period) or more, the voltage level of the third comparison voltage V3 may increase to the sixth level or higher of the fourth comparison voltage V4. Accordingly, the timer output circuit 132-3 may output the timer signal S2 of low level.

On the other hand, if the first controller 110 is in the normal state while outputting the timer signal S2 of high level and both control signal CS and safety signal SS are changed to high level, the fourth comparison voltage generation circuit 132-2 may output the fourth comparison voltage of the seventh level. V4. Regardless of the output of the comparator 131-3, the seventh level of the fourth comparison voltage V4 may be less than or equal to the voltage level of the third comparison voltage V3. Therefore, the timer output circuit 132-3 may immediately output the timer signal S2 of low level if both control signal CS and safety signal SS are changed to high level.

The timer output circuit 132-3 may include a comparator including input terminals to which the third comparison voltage V3 and the fourth comparison voltage V4 are input, and an output terminal to which the timer signal S2 is output.

The timer signal S2 output from the timer output circuit 132-3 may be transmitted to the output node N1 of the retention circuit 130 to control the output of the retention signal RTS. The signal S1 of high level output from the comparator 131-3 may be output as the retention signal RTS while the level of timer signal S2 maintains the high level. If the timer signal S2 is changed to low level, the voltage of the node N1 is changed to low level by the timer signal S2, and as a result, the output of retention signal RTS may be stopped. In addition, as the voltage of node N1 changes to the low level, the latch function of the latch circuit 131 is turned off, and the comparator 131-3 may stop outputting the signal S1 of high level.

Meanwhile, the off signal OS may be applied to the output node N1 of the retention circuit 130 from a retention control circuit 140 described below. The off signal OS may be a signal of low level. Therefore, while the off signal OS is applied, the voltage of the node N1 is maintained at a low level, and the output of the retention signal RTS may be blocked. In addition, the latch function of the latch circuit 131 and the timer function of the timer circuit 132 are also turned off, so that the retention function of the retention circuit 130 may be disabled.

Figure 4:
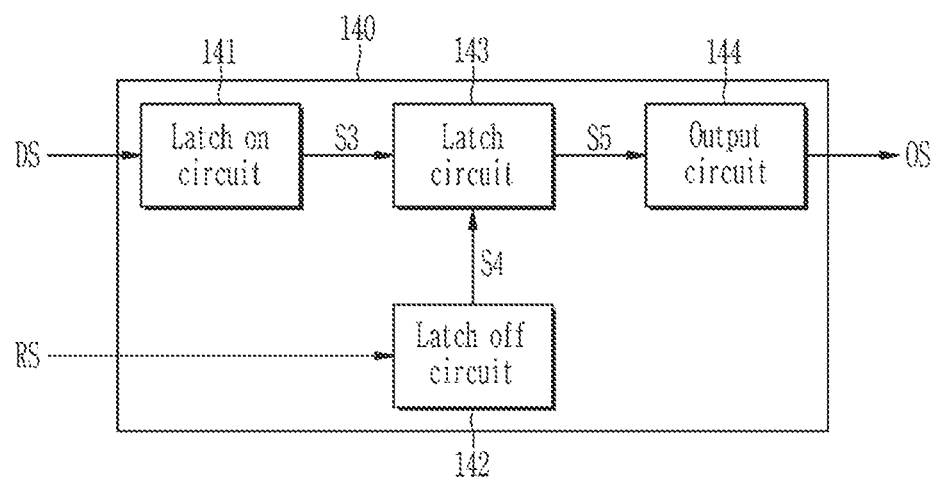
FIG. 4 is a view schematically showing a retention control circuit according to some embodiments.

FIG. 4 is a view schematically showing a retention control circuit according to some embodiments.

Referring to FIG. 4, a retention control circuit 140 according to some embodiments may include a latch on circuit 141, a latch off circuit 142, a latch circuit 143, and an output circuit 144.

The latch on circuit 141 operates if the disable signal DS is received from the first controller 110, and may output a latch on signal S3 to the latch circuit 143 to turn on the latch function of the latch circuit 143 during the operation.

The latch off circuit 142 operates if the reset signal RS is received from the first controller 110, and may output a latch off signal S4 to the latch circuit 143 to turn off the latch function of the latch circuit 143 during the operation.

If the latch circuit 143 receives the latch on signal S3, the latch function may be turned on.

If the latch function is turned on, the latch circuit 143 may output a latch signal S5 for controlling the output circuit 144 to output the off signal OS. If the output of the latch signal S5 is started, the latch circuit 143 may maintain the output of the latch signal S5 until the latch function is turned off by the latch off circuit 142.

The latch circuit 143 may turn off the latch function if the latch off signal S4 is received while the latch function is turned on. The latch circuit 143 may block the output of the latch signal S5 if the latch function is turned off. If the latch function is turned off, the latch circuit 143 may stop outputting the latch signal S5 until the latch function is turned on again according to the latch on circuit 141.

If the latch signal S5 is received from the latch circuit 143, the output circuit 144 may output the off signal OS to the retention circuit 130. If the reception of the latch signal S5 is blocked, the output circuit 144 may stop outputting the off signal OS.

As described above, if the retention function of the retention circuit 130 is to be disabled, the first controller 110 may disable the operation of the retention circuit 130 by outputting the disable signal DS in a form of a single pulse. On the other hand, if to operate the retention circuit 130 is again required while the operation of the retention circuit 130 is disabled, the operation of the retention circuit 130 may be enabled only by outputting the reset signal RS in the form of the single pulse.

Figure 5:
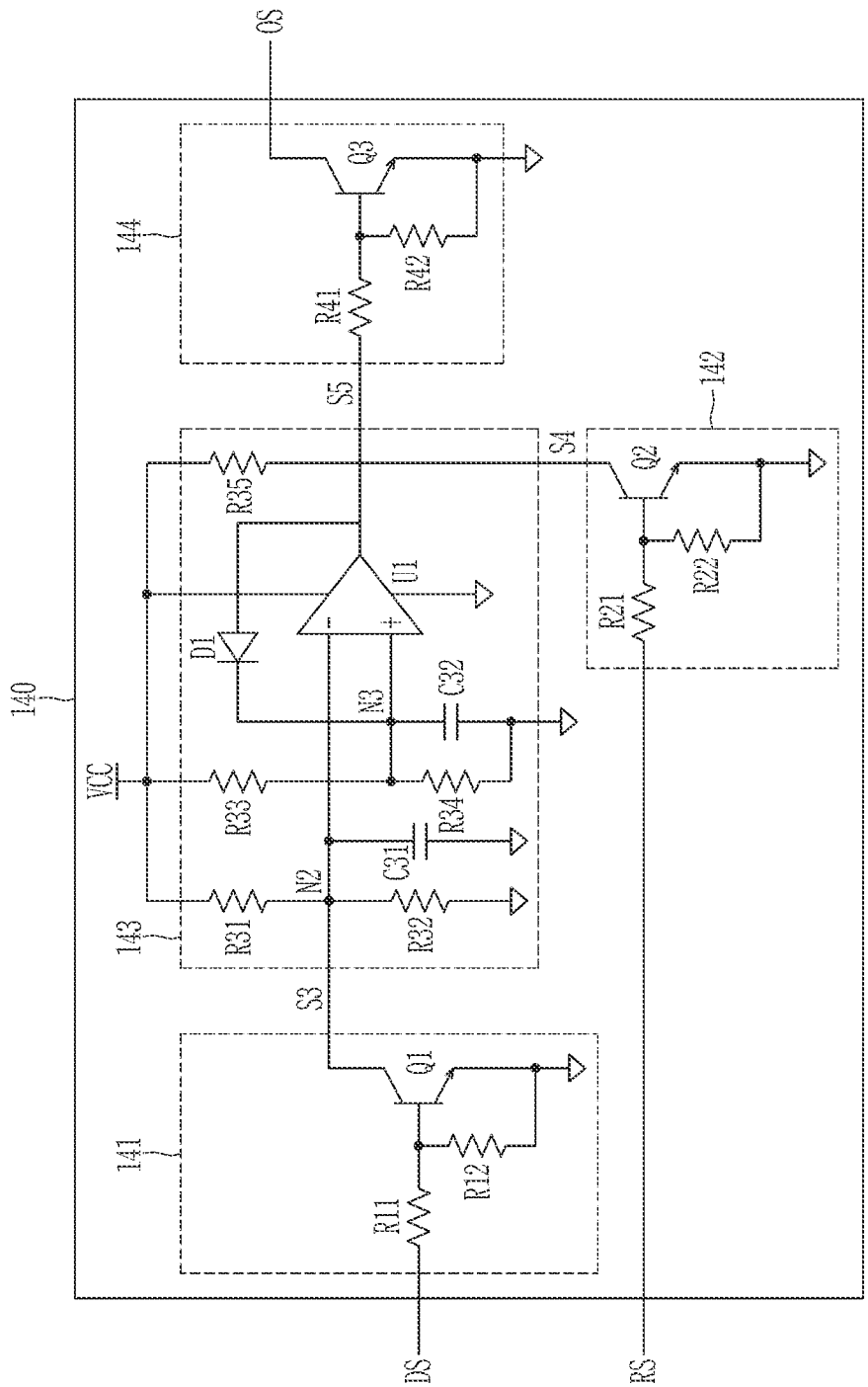
FIG. 5 is a view illustrating a circuit configuration of a retention control circuit according to some embodiments.

FIG. 5 is a view showing an example of a circuit diagram of a retention control circuit according to some embodiments.

Referring to FIG. 5, a latch on circuit 141 of a retention control circuit 140 according to some embodiments may include a transistor Q1.

The transistor Q1 may include a first terminal connected to the output terminal of the latch on circuit 141, a second terminal connected to ground, and a control terminal. The control terminal of the transistor Q1 may receive the disable signal DS from the first controller 110. If the disable signal DS is received, the transistor Q1 may be turned on and output the latch on signal S3 corresponding to low level to the output terminal of the latch on circuit 141.

The transistor Q1 may be an NPN transistor of which the control terminal is a base terminal, the first terminal and the second terminal are a collector terminal and an emitter terminal. The transistor Q1 may be in the turn-on state if the disable signal DS of high level is input, and be in the turn-off state if the voltage of the control terminal becomes low level.

The latch on circuit 141 may further include resistors R11 and R12 electrically connected to the control terminal of the transistor Q1 for the stable operation of the transistor Q1.

The latch off circuit 142 may include a transistor Q2.

The transistor Q2 may include a first terminal connected to the output terminal of the latch off circuit 142, a second terminal connected to a ground, and a control terminal. The control terminal of transistor Q2 may receive the reset signal RS from the first controller 110. The transistor Q2 may be turned on if the reset signal RS is received, and may output the latch off signal S4 corresponding to low level to the output terminal of the latch off circuit 142.

The transistor Q2 may be an NPN transistor in which a control terminal is a base terminal, and a first terminal and a second terminal are a collector terminal and an emitter terminal, respectively. The transistor Q2 may be in the turn-on state if the reset signal RS of high level is input, and be in the turn-off state if the voltage of the control terminal becomes low level.

The latch off circuit 142 may further include resistors R21 and R22 electrically connected to the control terminal of the transistor Q2 for the stable operation of the transistor Q2.

The latch circuit 143 may include a comparator U1, a diode D1, and voltage distribution circuits respectively connected to input terminals of the comparator U1.

The first voltage distribution circuit may include a resistor R31 connected between the power node VCC and the node N2, and a resistor R32 connected between the node N2 and the ground. The node N2 may be connected to the first input terminal (e.g., a negative input terminal) of the comparator U1, and the output terminal of the latch on circuit 141.

The first voltage distribution circuits R31 and R32 may transmit the voltage distributed from the power voltage (e.g., 5V) applied to the power node VCC to the first input terminal of the comparator U1 depending on whether the latch on signal S3 is output. If the latch on signal S3 is not output from the latch on circuit 141, the first voltage distribution circuits R31 and R32 may transmit the voltage obtained by distributing the power voltage applied to the power node VCC through resistors R31 and R32 to the first input terminal of the comparator U1 as a comparison voltage. If the latch on signal S3 of low level is output from the latch on circuit 141, the latch on signal S3 may be transmitted as a comparison voltage to the first input terminal of the comparator U1.

The second voltage distribution circuit may include a resistor R33 connected between the power node VCC and the node N3, and a resistor R34 connected between the node N3 and the ground. The node N3 may be connected to the second input terminal (e.g., a positive input terminal) of the comparator U1 and the diode D1.

The second voltage distribution circuits R33 and R34 may transmit the voltage distributed from the power voltage applied to the power node VCC depending on the voltage applied to the node N3 through the diode D1 to the second input terminal of the comparator U1. The second voltage distribution circuits R33 and R34 may transmit the voltage obtained by dividing the power voltage applied to the power node VCC through the resistors R33 and R34 to the second input terminal of the comparator U1 as a comparison voltage if the voltage transmission through the diode D1 is blocked. If the voltage is applied to the node N3 through the diode D1, the voltage applied to the node N3 through the diode D1 may be transmitted as a comparison voltage to the second input terminal of the comparator U1.

The comparator U1 may include first and second input terminals respectively connected to the node N2 and the node N3, and an output terminal connected to the output terminal of the latch circuit 143. The comparator U1 may compare the comparison voltages input through the first and second input terminals and output the output signal to the output terminal in response to the comparison result. The comparator U1 may output the output signal of high level (i.e., the latch signal S5) if the comparison voltage input through the second input terminal is higher than the comparison voltage input through the first input terminal. If the comparison voltage input through the second input terminal is less than or equal to the comparison voltage input through the first input terminal, the comparator U1 may stop the output of the latch signal and maintain the output of low level.

The comparison voltage transmitted to the second input terminal of the comparator U1 by the second voltage distribution circuits R33 and R34 may be less than or equal to the comparison voltage transmitted to the first input terminal of the comparator U1 by the first voltage distribution circuits R31 and R32. Therefore, while the latch on signal S3 is not output from the latch on circuit 141, the comparison voltage applied to the second input terminal of the comparator U1 maintains less than the comparison voltage applied to the first of the comparator U1 input terminal so that the comparator U1 may maintains the output of low level.

If the latch on signal S3 is output from the latch on circuit 141, the comparison voltage transmitted to the first input terminal of the comparator U1 may be lower than the comparison voltage transmitted to the second input terminal of the comparator U1 by the second voltage distribution circuits R33 and R34. Therefore, while the latch on signal S3 is output from the latch on circuit 141, the comparison voltage applied to the second input terminal of the comparator U1 is higher than the comparison voltage applied to the first input terminal of the comparator U1, so that the comparator U1 may output the output signal of high level (i.e., the latch signal S5).

The diode D1 may include an anode connected to the output terminal of the comparator U1 and a cathode connected to the second input terminal of the comparator U1. If the latch signal S5 of high level is output from the comparator U1, the diode D1 may transfer the latch signal S5 to the second input terminal of the comparator U1. The voltage transmitted to the second input terminal of comparator U1 by the diode D1 may be a voltage higher than the voltage applied to the first input terminal of the comparator U1 by the first voltage distribution circuits R31 and R32 and the voltage of the latch on signal S3. Therefore, the comparator U1 may maintain the output of the latch signal S5 regardless of whether the latch on signal S3 is output because the latch function is turned on by the diode D1 after the output of the latch signal S5 starts.

Meanwhile, the output terminal of the comparator U1 may be connected to the output terminal of the latch off circuit 142. Accordingly, the latch off signal S4 output from the latch off circuit 142 may be applied to the output terminal of the comparator U1. If the latch off signal S4 is output from the latch off circuit 142, voltage transmission by the diode D1 is blocked, and thus the latch function maintained by the diode D1 may be turned off. As the latch function turns off, the comparison voltage input to the second input terminal of the comparator U1 is changed to the voltage distributed by the second voltage distribution circuits R33 and R34, and thus, the output of the latch signal S5 of the comparator U1 may be blocked.

For the stable operation of the comparator U1, the latch circuit 143 may further include capacitors C31 and C32 connected between each input terminal and the ground, and a resistor R35 connected between the power node VCC and the output node of the comparator U1.

The output circuit 144 may include a transistor Q3.

The transistor Q3 may include a first terminal connected to the output terminal of the output circuit 144, a second terminal connected to ground, and a control terminal connected to the output terminal of the latch circuit 143. The control terminal of transistor Q3 may receive the latch signal S5 from the latch circuit 143. The transistor Q3 may be turned on if the latch signal S5 is received and output the off signal OS corresponding to low level to the output terminal of the output circuit 144.

The transistor Q3 may be an NPN transistor in which a control terminal is a base terminal, and a first terminal and a second terminal are a collector terminal and an emitter terminal, respectively. The transistor Q3 may be in a turn-on state if the latch signal S5 of high level is input, and may be in a turn-off state if the voltage of the control terminal becomes a low level.

The output circuit 144 may further include resistors R41 and R42 electrically connected to the control terminal of the transistor Q3 for stable operation of the transistor Q3.

Figure 6:
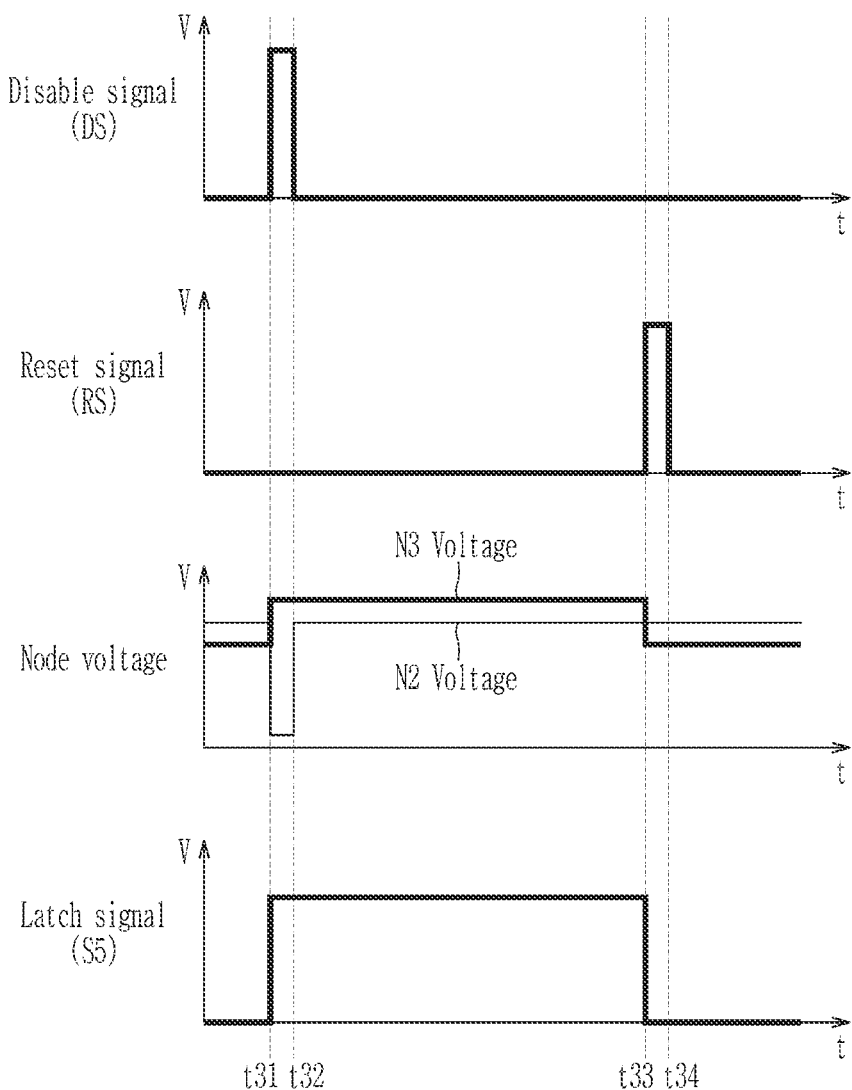
FIG. 6 is a view for explaining a latch operation of a retention control circuit according to some embodiments.

FIG. 6 is a view for explaining a latch operation of a retention control circuit according to some embodiments.

Referring to FIG. 6, in a default state, the voltage of each nodes N2 and N3 of the latch circuit 143 may be determined by the first and second voltage distribution circuit, and the voltage of the node N2 may maintain a higher state than the voltage of the node N3 (a section before a time t31). Therefore, in the default state, the output of the latch circuit 143 may be maintained at a low level.

Then, at the time t31, the first controller 110 outputs a disable signal DS in a form of a single pulse to disable the retention circuit 130, and the voltage of the node N2 may be lower than the voltage of the node N3 by the disable signal DS. Accordingly, the latch circuit 143 may initiate the output of the latch signal S5 of high level.

As the latch signal S5 of high level is output by the latch circuit 143, the voltage of the node N3 may rise by the voltage of the latch signal S5. Accordingly, even if the output of the disable signal DS is stopped at a time t32 and the voltage of the node N2 rises again, the voltage of the node N3 may still maintain a higher state than the voltage of node N2. Therefore, even if the output of the disable signal DS is stopped, the latch circuit 143 may maintain the output of high level of the latch signal S5. While the output of the latch signal S5 is maintained, the output circuit 144 may output the off signal OS to the retention circuit 130, and the retention circuit 130 may block the output of the retention signal RTS.

At the time t33, the first controller 110 may output the reset signal RS in the form of a single pulse to enable the retention circuit 130, and the output of the latch circuit 143 may be changed to a low level by the reset signal RS. As the output of the latch circuit 143 changes to the low level, the voltage of the node N3 decreases to a state lower than the voltage of the node N2, and this state may be maintained even if the output of the reset signal RS is stopped.

As the voltage of the node N3 becomes lower than the voltage of the node N2, the latch circuit 143 may stop outputting the latch signal S5 and maintain the output of low level. If the output of the latch signal S5 is stopped, the output of the off signal OS of the output circuit 144 may be stopped, and the output of the retention signal RTS of the retention circuit 130 may be allowed.

As described above, due to the latch function of the latch circuit 143, the first controller 110 may maintain the disable state of the retention circuit 130 only by outputting the disable signal DS in the form of the single pulse. In addition, even if the retention circuit 130 is required to be operated again in a state in which the operation of the retention circuit 130 is disabled, the first controller 110 may maintain the enable state of the retention circuit 130 only by outputting the reset signal RS in the form of the single pulse.

Figure 7:
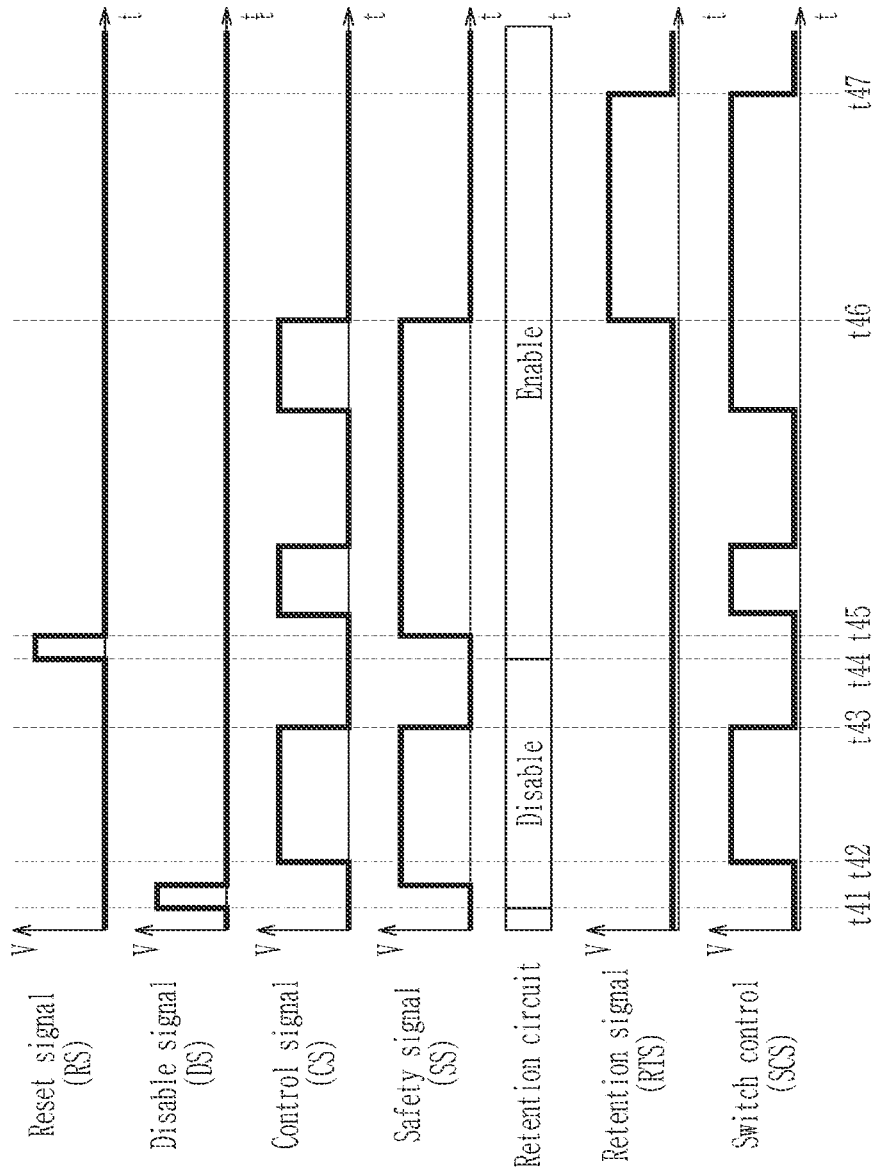
FIG. 7 is a diagram schematically showing a timing diagram of a switch control device according to some embodiments.

FIG. 7 is a view schematically showing a timing diagram of a switch control device 100 according to some embodiments.

Referring to FIG. 7, the first controller 110 may output a disable signal DS composed of one pulse signal once if it is required to disable the operation of the retention circuit 130 (referring to a time t41). Accordingly, the off signal OS is output from the retention control circuit 140, and the operation of the retention circuit 130 is disabled by the off signal OS, so that the output of the retention signal RTS may be blocked.

As the retention circuit 130 is disabled, the driver 210 may be controlled only by the control signal CS output from the first controller 110 regardless of the safety signal SS. That is, if the control signal CS of high level is received from the first controller 110, the driver 210 may output the switch control signal SCS of high level (referring to a time t42), if the control signal CS of low level is received from the first controller 110, it may output the switch control signal SCS of low level (referring to a time t43).

Thereafter, the first controller 110 may output the reset signal RS composed of one pulse signal to enable the operation of the retention circuit 130 (referring to a time t44). Accordingly, the retention control circuit 140 may stop the output of the off signal OS. If the output of the off signal OS is stopped, the retention circuit 130 may operate to output the retention signal RTS according to the control signal CS and the safety signal SS.

The retention circuit 130 may block the output of the retention signal RTS if the first controller 110 normally operates and outputs the safety signal SS of high level from the second controller 120 (referring to a time t45). As the output of the retention signal RTS is blocked, the driver 210 may be controlled by the control signal CS output from the first controller 110.

Then, if the first controller 110 operates abnormally and outputs the safety signal SS of low level from the second controller 120 (referring to a time t46), the retention circuit 130 controls the output of the retention signal RTS according to the level of the control signal CS that was being output immediately before. For example, if the first controller 110 was outputting the control signal CS of high level before operating in the abnormal state, the retention circuit 130 may output the retention signal RTS to maintain the on state of the switch 220.

If the output of the retention signal RTS starts, the retention circuit 130 may maintain the output of the retention signal RTS through the latch function and control the retention time of the retention signal RTS by using a timer function. That is, if the output time of the retention signal RTS continues for more than a time period (e.g., a set or predetermined time period) by using the timer function, the retention circuit 130 may block the output of the retention signal RTS (referring to a time t47).

While the retention signal RTS is being output from the retention circuit 130, the driver 210 may output the switch control signal SCS according to the retention signal RTS instead of the control signal CS output from the first controller 110.

Figure 8:
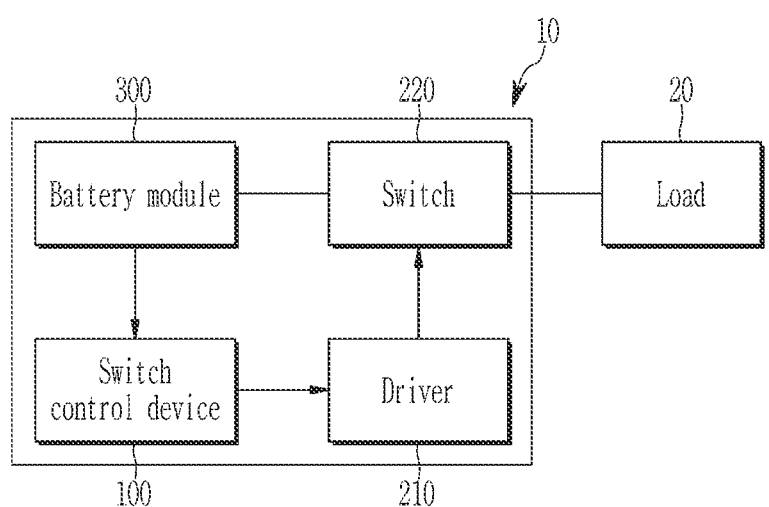
FIG. 8 is a view schematically showing a battery pack including a switch control device according to some embodiments.

FIG. 8 is a view schematically showing a battery pack including a switch control device according to some embodiments.

Referring to FIG. 8, the battery pack 10 may include a battery module 300, a switch 220, a driver 210, and a switch control device 100.

The battery module 300 may include at least one cell connected in series or in parallel to each other.

The switch 220 may control an electrical connection between the battery module 300 and the load 20, and the driver 210 may drive the switch 220 according to signals (the control signal CS and the retention signal RTS) input from the switch control device 100. The switch 220 may include a contactor, a relay, and the like.

The switch control device 100, as described with reference to FIG. 1, may include a first controller 110, a second controller 120, a retention circuit 130, and a retention control circuit 140.

The first controller 110 of the switch control device 100 may be a battery management system (BMS) of the battery pack 10. In this case, the first controller 110 may output the control signal CS, the disable signal DS, the reset signal RS, etc. based on a status information of the battery module 300, and information (e.g., a set or predetermined information), a status information, and a driving mode, of a system (e.g., a vehicle) in which the battery pack 10 is mounted, etc. For example, the first controller 110 may determine whether to open/close the switch 220 according to the state of the battery pack 10 or the system in which the battery pack 10 is mounted, and output the control signal CS for controlling the switch 220. Also, for example, if the system in which the battery pack 10 is mounted requests to disable the retention circuit 130, the first controller 110 may output the disable signal DS to disable the operation of the retention circuit 130. Then, if the enable of the retention circuit 130 is requested from the system in which the battery pack 10 is mounted, the first controller 110 may output the reset signal RS to enable the operation of the retention circuit 130.

The second controller 120 of the switch control device 100 may be a system basis chip (SBC). The SBC may be composed of an integrated circuit (IC) in which a voltage regulator, a supervision function, a reset generator, a watchdog function, a communication bus interface, and a wake-up logic are integrated.

As described above, in the switch control device 100 according to some embodiments, the operation of the retention circuit 130 may be disabled or enabled only by applying the disable signal DS or the reset signal RS in the form of the single pulse. Therefore, in a state where the switch control device 100 is already designed to include the retention circuit 130 in a design stage, if the operation of the retention circuit 130 must be blocked due to the customer's request, the operation of the retention circuit may be disable only with a simple software operation without the hassle of disassembling parts by checking this in the assembly stage of parts. In addition, the operation of the retention circuit 130 may be disabled or enabled according to the operation state of the battery pack 10, so that problems due to a malfunction of the retention circuit 130 may be prevented.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims. Therefore, those skilled in the art will understand that various modifications and other equivalent embodiments of the present invention are possible. Consequently, the true technical protective scope of the present invention must be determined based on the technical spirit of the appended claims, and their equivalents.

DESCRIPTION OF SOME OF THE REFERENCE SYMBOLS

10: battery pack
20: load
100: switch control device
110: first controller
120: second controller
130: retention circuit
131: latch circuit
131-1: first comparison voltage generation circuit
131-2: second comparison voltage generation circuit
131-3: comparator
132: timer circuit
132-1: third comparison voltage generation circuit
132-2: fourth comparison voltage generation circuit
132-3: timer output circuit
140: retention control circuit
141: latch on circuit
142: latch off circuit
143: latch circuit
144: output circuit
210: driver
220: switch
300: battery module

What is claimed is:
1. A switch control device comprising:
a retention circuit configured to receive a control signal and a safety signal, and to output a retention signal to a driver of a switch to maintain an on state of the switch based on the control signal and the safety signal;

a retention control circuit configured to disable the retention circuit, so that the output of the retention signal is blocked based on a disable signal being received;

a first controller configured to output the control signal to the driver to control operation of the switch, and to output the disable signal to the retention control circuit based on the retention circuit being disabled in a system to which the switch control device is mounted; and a second controller configured to output the safety signal according to an operation status of the first controller, wherein the driver is configured to control opening and closing of the switch based on the control signal or the retention signal.

2. The switch control device as claimed in claim 1, wherein:

the retention circuit comprises:

a circuit configured to receive the control signal and the safety signal, and to start outputting the retention signal according to the control signal based on the safety signal indicating an abnormal state of the first controller; and a timer circuit configured to stop the output of the retention signal based on a predetermined time period elapsing after the circuit starts outputting the retention signal.

3. The switch control device as claimed in claim 2, wherein:

the circuit is further configured to delay the received control signal for a predetermined time period based on the control signal being received, and to start output of the retention signal based on the delayed control signal indicating the on state of the switch.

4. The switch control device as claimed in claim 3, wherein:

the circuit comprises:

a first comparison voltage generation circuit configured to generate a first comparison voltage whose voltage level is determined according to the safety signal, a second comparison voltage generation circuit configured to generate a second comparison voltage whose voltage level is determined according to the delayed control signal, a comparator configured to control the output of the retention signal based on the second comparison voltage being higher than the first comparison voltage, and a diode including an anode connected to an output terminal of the comparator and a cathode connected between an input terminal of the comparator and the second comparison voltage generation circuit.

5. The switch control device as claimed in claim 4, wherein:

the voltage level of the first comparison voltage is configured to become a first level based on the safety signal corresponding to the abnormal state of the first controller, and to become a second level based on the safety signal indicating a normal state of the first controller, the voltage level of the second comparison voltage is configured to become a third level based on the delayed control signal corresponding to an off state of the switch, and to become a fourth level based on the delayed control signal corresponding to the on state of the switch, the diode is configured to maintain the voltage level of the second comparison voltage at a fifth level regardless of the control signal based on the comparator starting to output the retention signal, the second level is higher than the first level, the fourth level is higher than the third level, the fourth level is lower than the second level and higher than the first level, and the fifth level is higher than the second level.

6. The switch control device as claimed in claim 3, wherein:

the timer circuit comprises:

a third comparison voltage generation circuit configured to generate a third comparison voltage whose voltage gradually increases in response to an output time of the retention signal based on the retention signal being output from the retention circuit, a fourth comparison voltage generation circuit configured to generate a fourth comparison voltage whose voltage level is determined according to the control signal and the safety signal, and a timer output circuit configured to output a timer signal according to the third comparison voltage and the fourth comparison voltage.

7. The switch control device as claimed in claim 6, wherein:

the third comparison voltage is configured to become equal to or greater than the fourth comparison voltage based on a predetermined time period elapsing after the retention signal output starts, the timer output circuit is further configured to output the timer signal to stop the output of the retention signal based on the third comparison voltage being higher than the fourth comparison voltage.

8. The switch control device as claimed in claim 1, wherein:

the retention control circuit comprises:

a latch on circuit configured to output a latch on signal based on the disable signal being received;

a circuit configured to start outputting a latch signal based on the latch on signal being output from the latch on circuit; and the output circuit configured to output the off signal to the retention circuit to block the output of the retention signal based on the latch signal being output from the circuit.

9. The switch control device as claimed in claim 8, wherein:

the latch on circuit comprises:

a transistor including a control terminal configured to receive the disable signal;

a first terminal connected to the circuit; and a second terminal connected to a ground, wherein based on the disable signal being input to the control terminal, the transistor is configured to be turned on and to output the latch on signal to the circuit.

10. The switch control device as claimed in claim 8, wherein:

the circuit comprises:

a comparator including a first input terminal connected to a first node connected to the latch on circuit, a second input terminal connected to a second node, and an output terminal, and configured to control output of the latch signal according to a result of comparing a voltage of the first node and the second node;

a first voltage distribution circuit configured to transmit a first voltage distributed from a power voltage to the first node;

a second voltage distribution circuit configured to transmit a second voltage distributed from the power voltage to the second node; and a diode including an anode connected to the output terminal of the comparator and a cathode connected to the second node, and configured to transmit a third voltage to the second node if output of the latch signal starts.

11. The switch control device as claimed in claim 10, wherein:

based on the latch on signal being output from the latch on circuit, the voltage of the second node is changed to the voltage of the latch on signal, the second voltage is lower than the first voltage, the voltage of the latch on signal is lower than the second voltage, and the third voltage is higher than the first voltage.

12. The switch control device as claimed in claim 8, wherein the output circuit comprises:

a transistor including a control terminal configured to receive the latch signal;

a first terminal connected to the retention circuit; and a second terminal connected to a ground, wherein the transistor is configured to be turned on and to output the off signal to the retention circuit based on the latch signal being input to the control terminal.

13. The switch control device as claimed in claim 8, wherein:

the first controller is further configured to output a reset signal to the retention control circuit based on an enable of the retention circuit being requested from the system, and the retention control circuit further includes a latch off circuit configured to block output of the latch signal based on the reset signal being received while the retention circuit is disabled.

14. The switch control device as claimed in claim 13, wherein the latch off circuit comprises:

a transistor including a control terminal configured to receive the reset signal;

a first terminal connected to the circuit; and a second terminal connected to a ground, wherein based on the reset signal being input to the control terminal, the transistor is configured to be turned on and to output a latch off signal to block the output of the latch signal to the circuit, and based on the latch off signal being received, the circuit is configured to turn off a latch function to block the output of the latch signal.

15. A battery pack comprising:

a battery module;

a switch configured to control an electrical connection between the battery module and a load;

a driver configured to control opening and closing of the switch; and the switch control device of claim 1, wherein the driver is further configured to control the opening and closing of the switch according to a signal received from the switch control device.

\* \* \* \* \*